Nov. 19, 1968 C. W. R. HICKIN ET AL 3,412,261
ANALOG VOTER
Filed Oct. 18, 1965
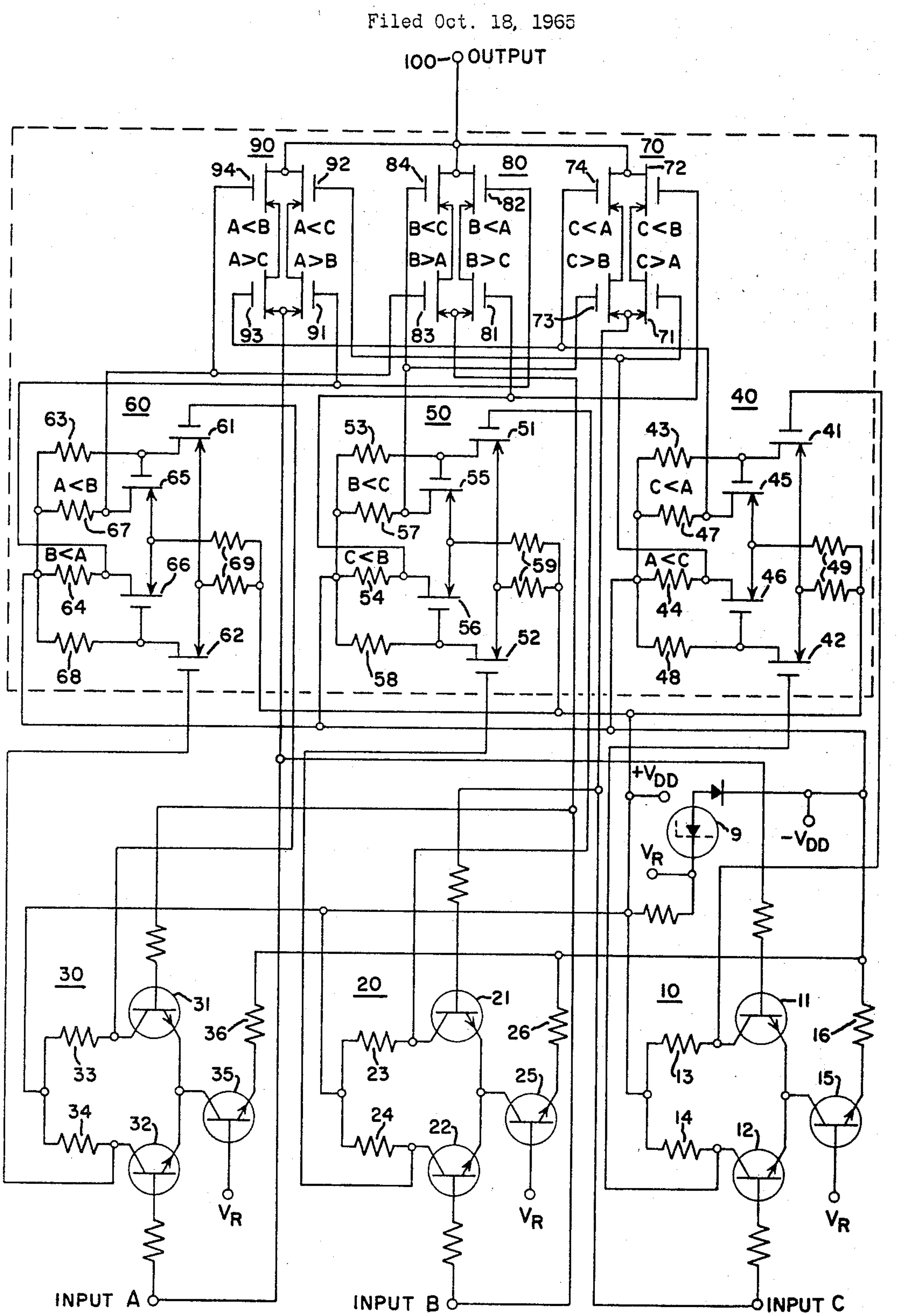

United States Patent Office 3,412,261
Patented Nov. 19, 1968

3,412,261
ANALOG VOTER

Charles W. R. Hickin and Richard P. Quinlivan, Binghamton, N.Y., assignors to General Electric Company, a corporation of New York Filed Oct. 18, 1965, Ser. No. 496,961
5 Claims. (Cl. 307—219)

This invention is directed to novel solid-state circuits for selecting the median of three redundant analog voltages, frequently called "voting," whereby a correct signal is made available at the output if no more than one failure affects the redundant input signals. It is particularly useful for integrated circuit construction.

Analog and other linear circuits present numerous special problems in respect to implementation in redundant form. For example, where a median signal is to be selected, it generally means that several analog voltage switching operations must be performed. However, switching analog signals without significant signal modification with solid-state devices, particularly with integrated circuits is very difficult. A switch requires a three- or four-terminal element to which two signals are applied, an analog signal to be switched, and a switching signal. Among other factors, the smaller a switching element is, the more difficult it is to keep the signals isolated. It is necessary that a given switching signal produce the same ON-OFF switch condition, regardless of the analog signal level and that the switching signal not modify the level of the analog signal except for the ON-OFF conditions.

Particularly with three-terminal switches arranged in series, it is very difficult to insure proper operation, because the switching and analog signals are not naturally at the same levels. Another example of the problems presented is that most solid-state devices produce voltage offsets, when conducting, across their n-p and p-n junctions, typically a major fraction of a volt, which introduces too much error for a precision system having a full scale voltage level on the order of ten volts.

Accordingly, an object of the invention is to provide a median selector for redundant linear signals which utilizes solid-state switching devices.

Another object of the invention is to provide a solid-state median selector using switches which do not modify the redundant signals.

It is a further object of the invention to provide a median selector which is readily fabricated as an integrated package in one or more arrays.

Briefly stated, in accordance with certain aspects of the invention, a median selector has been provided which relies on simple switches and differential amplifiers. If metal-oxide-semiconductor switches are selected, it has been found that a series of switches can be connected and still maintain a good load characteristic for the switching signals. Also, it has been found that appropriate switching signals can be obtained by directly comparing the three input signals in pairs with differential amplifiers.

The invention, together with further objects and advantages thereof, may best be understood by referring to the following description taken in conjunction with the appended drawing in which like numerals indicate like parts and in which the drawing is a schematic diagram of a preferred circuit embodying the invention.

The preferred embodiment of the invention, for precision applications, has three redundant input signals A, B and C which are applied in parallel to a set of analog switch circuits 70, 80, and 90, and a set of differential amplifiers 10, 20, and 30. These differential amplifiers are augmented by a corresponding set of cascaded differential amplifiers 40, 50, and 60. The differential amplifier 10 includes a pair of parallel transistors 11 and 12 which have their emitters coupled to a transistor 15 that is adapted to produce a constant current. The transistors 11 and 12 have redundant signals A and C applied to their respective base terminals. The collector resistors 13 and 14 and the bias voltage $+V_R$ are selected so that the transistor 11 or 12 to which a higher voltage, A or C is applied will turn ON and the remaining transistor will turn OFF. The transistors and resistors 21–26 and 31–36 for differential amplifiers 20 and 30 respectively operate in the same manner as the components 11–16 of differential amplifier 10 but receive different pairs of input redundant signals, namely B and C, and B and A, respectively. The reference voltage $V_R$ for all these amplifiers is controlled by Zener diode 9 in parallel with the supply voltage terminal. As a result, the voltages at the collectors of each differential amplifier have two natural levels and produce complementary signals. For example, if input A is greater than C, the collector voltage of transistor 12 will be positive and the collector voltage of transistor 11 will be of a lower potential. If input C is greater than input A, these conditions are reversed. In order to provide reliable switching signals, these differential amplifier output signals are processed further. It has been found that from the point of view of switching logic, these signals can be used directly without further logic operations. However, it is important that they be amplified sufficiently such that the dead-band is minimized. Accordingly, the metal-oxide-semiconductor field-effect transistors 41, 45, 42 and 46 respond to differential amplifier 10. By direct coupling, the collector of transistor 11 is connected to the gate of field-effect transistor 41 and the collector of transistor 12 is connected to the gate of transistor 42. With resistor 43 of substantially greater impedance than resistors 49, the drain voltage is negative when transistor 41 is not conducting but positive when it is conducting. The same holds true for transistor 45 which has its gate directly coupled from the drain of transistor 41. The complementary operation occurs with field-effect transistors 42 and 46. Field-effect differential amplifier circuits 50 and 60 are identical with differential amplifier 40, the transistors and resistors 51–59 and 61–69 operating in the same manner as components 41–49. Median selection is provided by the twelve-field-effect transistors incorporated in analog switch circuits 70, 80, and 90. Analog switch circuit 70 provides a closed path for input signal C to the output terminal 100 through two parallel pairs of series switches. Transistor 71 is turned ON when input C is greater than A and transistor 72 is turned ON when C is less than B. The complementary relationship, $C>B$ and $C<A$ produces the same effect with the respective transistors 73 and 74. Switch circuits 80 and 90 operate in the same way as transistors 81–84 and 91–94 corresponding to transistors 71–74, but with different pairs of control signals.

It can be seen that with the apparatus shown, the twelve switching signals necessary for the switching circuits 70, 80 and 90 are all derived from three simple differential amplifier circuits 10, 20 and 30. This is made possible by the switching circuits being arranged so that each gating signal is used twice and the differential amplifiers provide complement signals that are also directly useful for the switching operations. By choosing the MOS transistors, the switch control signals are applied to gate elements above the body of the semiconductor chip from which the transistor is fabricated. Metal-oxide-semiconductor technology makes possible the fabrication of more than one transistor on the same chip without there being undesirable cross-coupling of signals. In fact, all of the MOS transistors can be fabricated on the same chip together with resistor sections. In the preferred embodiment of the invention, the most sensitive differential amplifiers are used. This is made possible by the use of separate semiconductor chips for the differential amplifiers 10, 20 and 30.

The reason for having very sensitive differential amplifiers is that it is essential to provide positive switching signals. When the input signals are very closely spaced as to voltage level, it requires a correspondingly large gain to amplify the difference into a switch control signal of the desired level. The result is that this eliminates dead-band. Where the median selector is designed on the assumption that there will be no more than one failure, and, in fact, two of the input signals are substantially identical, either signal can be used with confidence. However, it is important that the switching circuit through which it passes be closed completely so that there is no attenuation of the median selected signals. This requires that the switching signals generated be at acceptable levels.

In the preferred embodiment illustrated, switching circuits 70, 80 and 90 perform the dual functions of analog switching a selected one of the redundant input signals to the output and part of the logic function by selective combination of conditions which determine the analog switching operations. Under some conditions, it is better to separate the functions. This results in the use of separate analog switching transistors with the switching circuits 70, 80 and 90 being relied upon only to gate the separate analog switching transistors. This arrangement can actually save chip space where it is desirable to make the analog switching transistors large, as is usually the case where very low ON resistance is desired.

While particular embodiments of the invention have been shown and described herein, it is not intended that the invention be limited to such disclosure, but that changes and modifications can be made which retain the differential amplifier type of circuit for switching logic and the equivalent of metal-oxide-semiconductor transistors for analog switching so as to obviate junction voltage offsets, to provide uniform gating, and to provide effective signal isolation and remain within the scope of the claims.

What is claimed is:

1. A median selector, for accepting three redundant electrical analog D-C signals and making available an output signal having the median value of the three at any instant so that before or after a single failure in the sources of the redundant signals only a correct signal is available for the system, comprising:

(a) six pairs of series connected switches, each pair being adapted to select an input signal to an output terminal;

(b) a set of comparators for comparing redundant input signals in pairs and generating a set of signals representing which input signals are greater and their complements;

(c) means to apply said set of signals to gates on said switches so as to provide median selection;

(d) said median selector including a set of three parallel, normally open, semiconductor switches formed on a grounded body and arranged in series with the respective input signals and adapted to have one switch closed in accordance with which of said pairs of switches is closed.

2. The median selector of claim 1, further comprising:

(e) means connecting each of the three input signals to two of said pairs of series switches which are closed when that input signal is a median value.

3. The median selector of claim 1 wherein:

(e) said set of parallel switches are metal-oxide-semiconductor transistors so as to provide substantially zero voltage offset for the redundant input signals.

4. A solid-state analog voter comprising:

(a) three differential amplifiers;

(b) six pairs of series connected field-effect metal-oxide-semiconductor switches;

(c) input means adapted to connect each of three parallel redundant analog signals to two of said differential amplifiers for comparison;

(d) median selection interconnection means including two complementary pairs of switch control connections from each of said differential amplifiers to said switches.

5. An analog voted comprising:

(a) an integrated, multi-element metal-oxide-semiconductor field-effect device having a common grounded body;

(b) a set of twelve field-effect switches formed on said device common grounded body;

(c) interconnecting means from three input terminals for redundant analog signals to a common median output terminal arranged so that the parallel analog signals pass through parallel respective series pairs of said analog switches;

(d) logic means for comparing the input signals and controlling said switches accordingly so that there is a closed path for the median signal only.

No references cited.

ARTHUR GAUSS, *Primary Examiner.*

D. D. FORRER, *Assistant Examiner.*